United States Patent [19]

Appleton

[11] Patent Number: 4,529,008

[45] Date of Patent: Jul. 16, 1985

[54] METHOD OF AND APPARATUS FOR REPAIRING DRAINS AND UNDERGROUND PIPELINES

[75] Inventor: William J. Appleton, Northwich, England

[73] Assignee: AMK Pipe Technology Limited, Northwich, England

[21] Appl. No.: 489,541

[22] Filed: Apr. 28, 1983

[30] Foreign Application Priority Data

Jun. 11, 1982 [GB] United Kingdom ................ 8217046
Mar. 16, 1983 [GB] United Kingdom ................ 8302738

[51] Int. Cl.³ ........................................ D03D 49/00
[52] U.S. Cl. ...................................... 138/97; 405/154
[58] Field of Search ................ 405/154, 156; 138/97; 166/277; 117/2

[56] References Cited

U.S. PATENT DOCUMENTS

| | | | |
|---|---|---|---|
| 2,187,275 | 1/1940 | McLennan | 166/277 X |
| 3,103,235 | 9/1963 | Stringham | 138/97 |
| 3,129,759 | 4/1964 | Tillman | 166/277 |
| 3,269,421 | 8/1966 | Telford et al. | 138/97 |
| 3,307,996 | 3/1967 | Keneipp | 138/97 X |
| 3,606,913 | 9/1971 | Yie | 138/97 |
| 3,618,639 | 11/1971 | Daley | 138/97 |
| 3,750,711 | 8/1973 | Conklin et al. | 138/97 |
| 3,762,446 | 10/1973 | Tungseth et al. | 138/97 |
| 3,834,422 | 9/1974 | Larson | 138/97 |
| 3,894,131 | 7/1975 | Speech | 138/97 |

FOREIGN PATENT DOCUMENTS 212715 3/1924 United Kingdom ................ 138/97

Primary Examiner—Dennis L. Taylor
Attorney, Agent, or Firm—Ross, Ross & Flavin

[57] ABSTRACT

For repairing a drain or pipeline defect (which in the illustrated case is a major collapse, but may be a minor leak, hole or other defect), after cleaning by high pressure water or other methods and/or after reaming out the drains or pipeline, an ejector body is pushed by rods or is drawn into place by means of a hauling cable until its leading end is to one side and its trailing end is to the other side of the defect. Thereupon, sealing rings are inflated to seal the body's ends, and the components of a multi-component hardening composition are supplied by way of ducting so as to meet and mix in the body and emerge through holes to fill the entire defect and any registering voids in the surrounding earth. Before the composition is fully set, the body is displaced along the drain or pipeline, and the remaining hardening compound serves to replace the defective or missing drain or pipeline material. After withdrawal of the body, the repair may be reamed again, and/or polished.

5 Claims, 10 Drawing Figures

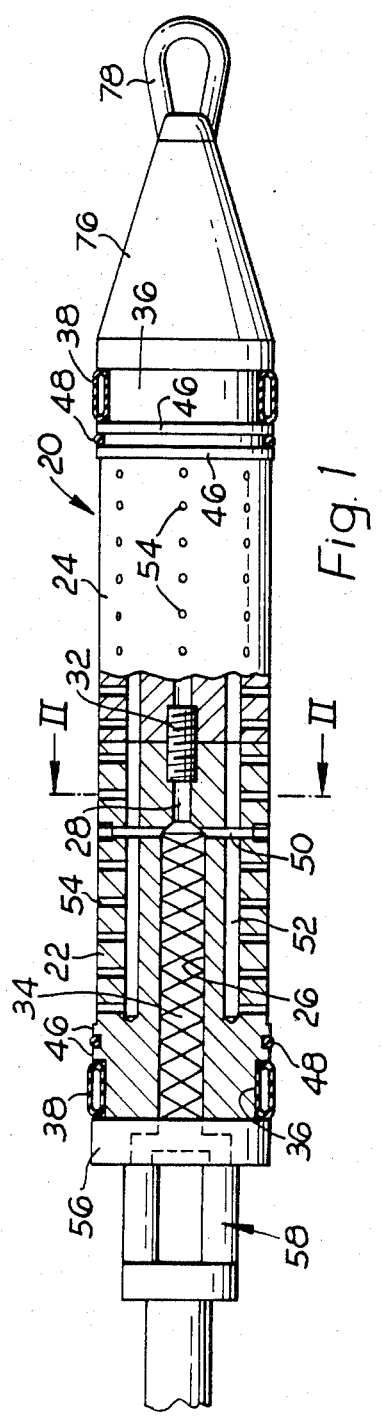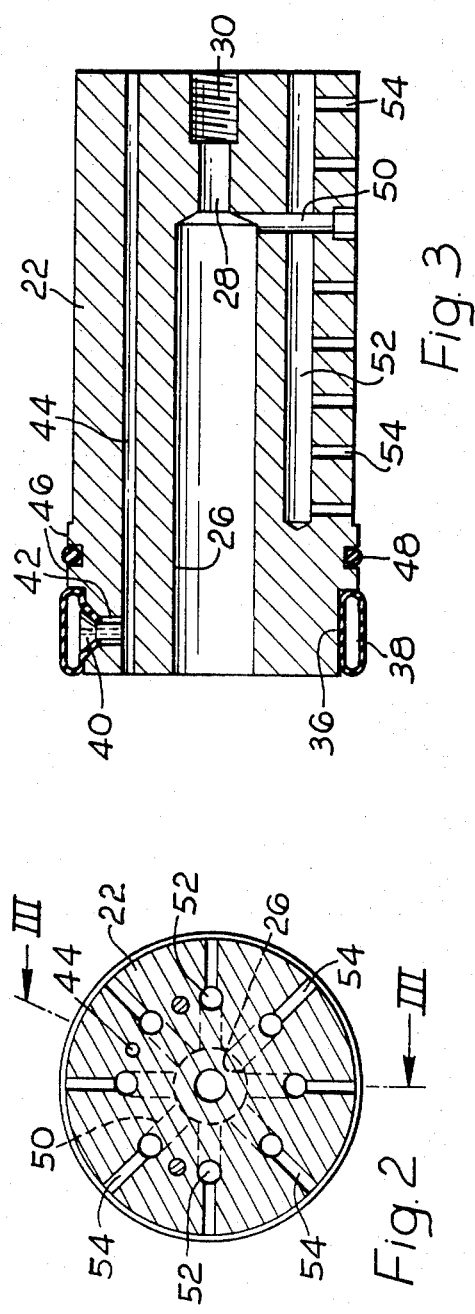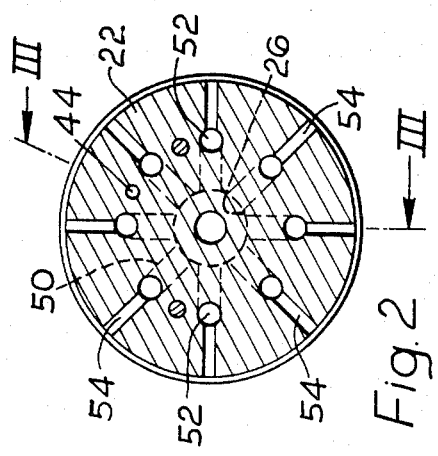

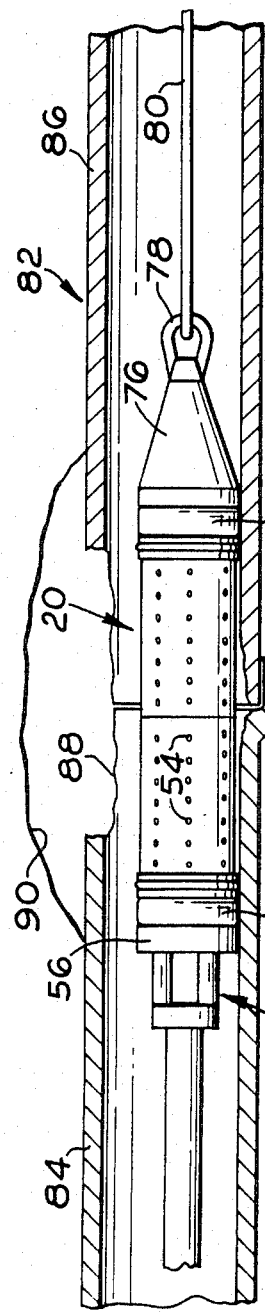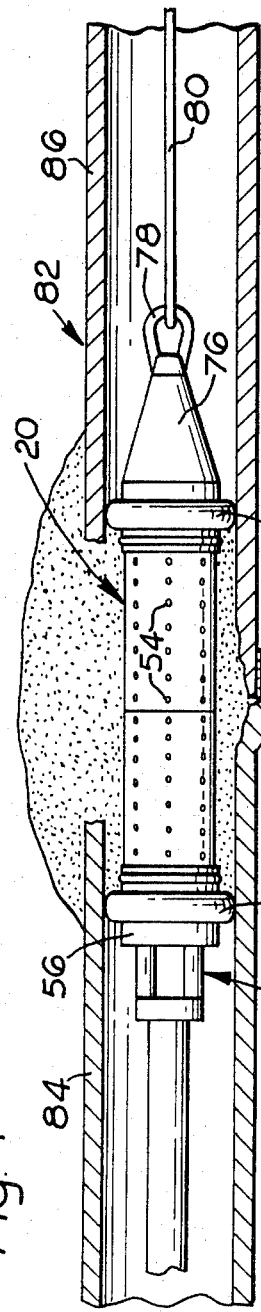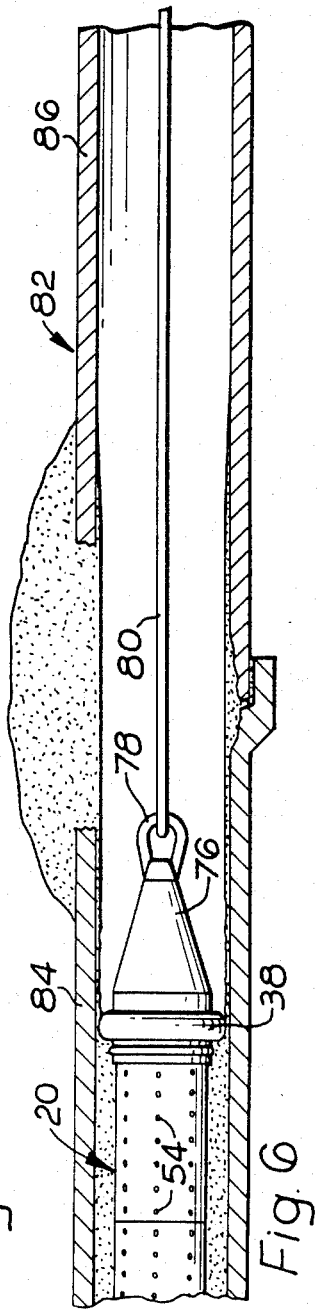

METHOD OF AND APPARATUS FOR REPAIRING DRAINS AND UNDERGROUND PIPELINES

BACKGROUND OF THE INVENTION

This invention concerns a method of and apparatus for use in repairing drains and underground pipelines, that is to say from small to relatively large-diameter high pressure or other pipe work, usually underground or enclosed in some surrounding material such as concrete, and intended to convey fluids, such as potable water, waste water, certain semi solids, and solids suspended in fluids, or gases.

BRIEF DESCRIPTION OF THE PRIOR ART

Various devices have already been proposed for propulation through underground drains and pipelines for various purposes. For instance arrangements have been devised which progress scrapers, corers, probes, obturators and the like along and through pipes, e.g. to predetermined positions for performing predetermined operations. Insofar as to repair of drains and the like is concerned, however, arrangements as so far proposed have been suitable only for stopping up relatively trivial leaks. Thus, for example, it has been proposed to provide an arrangement in the form of a carriage which is moved along the pipe of a drain and which has a surrounding cover sheet which is expanded radially into contact with the pipe at each side of the leak (which may for instance be at a conventional joint between two adjacent pipe sections). This having been achieved, grout is pumped through a radial opening in the cover sheet so as to flow into the leak, and this eventually sets and seals the leaks.

As has already been mentioned, this proposal in general can be used only in relation to relatively trivial or small defects in the pipework. It would not be possible to use it, for example, in relation to major collapse or disintegration of part of a pipe run, whether at a joint or otherwise, since by its very nature, it can be used only for the introduction of quite fluid grouts which will remain more or less in situ in narrow gaps or joints in the pipework being repaired, and which are subject to slumping.

OBJECT OF THE INVENTION

An object of the present invention is to provide a method of, and apparatus for use in, the repair of drains and other pipelines which, although they can, if desired, be used for repairing relatively minor defects, can be employed effectively for repairing and/or restoring very large and significant defects, such as collapse and/or disintegration of substantial lengths thereof, to the extent of replacing the defective portion.

BRIEF RESUMEE OF THE INVENTION

With this object in view, the present invention provides, as a first aspect thereof, a method of repairing a defect in a drain or other pipeline which comprises drawing a tubular ejector body into said drain or pipeline to a position such that the leading end and the trailing end of said body are disposed respectively to one side and to the other side of the defect, in register with respective relatively intact portions of the drain or pipeline, sealing said leading end and said trailing end relative to their respective relatively intact portions of the drain or pipeline by inflating respective sealing rings disposed around the body at or near said ends, supplying a multi-component setting compound to the ejector body so that its components mix in said body and are ejected thereby into the defect, and thereafter displacing the ejector body along the drain or pipeline (e.g. by means of an attached rod or cable) prior to complete setting of said compound but whilst it is in a coherent condition.

Preferably during the displacement the inflatable sealing rings are manipulatively deflated so as to taper to nothing, the residual setting compound thereby ensuring no flow restrictions in the repaired drain or pipeline.

If desired, the ejector body may be progressed stepwise through the drain or pipeline from defect to defect, thereby carrying out as many repairs as may be required to renovate an entire drain or pipeline run.

To facilitate movement of the ejector body into position, and to shift away any debris which may be present at the location of the defect, a reamer may be drawn through the drain or pipeline so as to traverse the defect, prior to introduction of the ejector body. Alternatively such debris may be removed by high pressure water or sand jetting.

Moreover, a reamer or the reamer may be drawn through the drain or pipeline so as to traverse the repaired defect or defects, after removal of the ejector body and during or after setting of the setting compound, so as to ensure circularity of the repaired drain or pipeline section.

Before and during the performance of the repair, scanning means may be introduced into the drain or pipeline to enable the repair operations to be observed, e.g. by television or other means such as fibre optics apparatus.

During the performance of the repair, mechanical, electronic and/or computerised equipment may be used to locate and relocate the repair site and to monitor and record the repair operation.

The invention includes, of course, a drain or pipeline which has been repaired by the method as aforesaid.

A second aspect of the invention provides apparatus for use in repairing a defect in a drain or pipeline comprising an ejector body of tubular configuration adapted to enable it to be drawn or pushed into a drain or pipeline to such a position that the leading end and the trailing end thereof are disposed respectively to one side and to the other side of the defect, respective inflatable sealing rings disposed around said body at or adjacent said ends, means enabling fluid (i.e. air or liquid) under pressure to be supplied to said sealing rings for inflating them, and ducts for supplying the components of a multi-component setting compound individually to the interior of said body so as to mix therein, the body having a plurality of ejector openings for permitting ejection of the mixed setting compound thereon around the outer curved surface of the body, between the sealing rings.

The construction of the ejector body is preferably such that it comprises a central bore for the reception and mixing of the setting compound components, said central bore connecting with a plurality of axially-directed passages from which radial outlets lead to the outer curved surface of the body. This central bore may accommodate a succession of mixing elements which impart a swirling motion to the components.

To enable the ejector body to be constructed, as desired, to any practical length according to the drain or pipeline defect to be repaired, it preferably comprises two end sections, substantially of similar configuration, arranged in reversed relative disposition. Then, any desired practical number of further sections may be provided between these end sections to achieve the desired overall length of the body.

For drawing the body through a drain or pipeline, the leading end thereof is conveniently provided with an eye for attachment of a cable thereto. Further the leading end is preferably tapered to facilitate its entry into relatively intact pipework after traversing a collapse.

The apparatus of the invention preferably further includes a reamer assembly for drawing through the pipeline or drain, before repair thereof using the ejector body, and/or after such repair.

The apparatus of the invention preferably further includes high pressure water/sand jetting equipment for introduction into the pipeline or drain for descaling or cleaning of the surfaces adjacent to and at the side of areas to be repaired.

BRIEF DESCRIPTION OF THE DRAWINGS

The invention will be described further, by way of example, with reference to the accompanying drawings, in which:

FIG. 1 is a diagrammatic part-section side elevation illustrating a preferred embodiment of the drain or pipeline repairing apparatus according to the invention;

FIG. 2 is a diagrammatic cross-section taken on the line II—II of FIG. 1;

FIG. 3 is an enlarged detail of one of the sections of the apparatus of FIGS. 1 and 2;

FIG. 4 is a diagrammatic part-sectional side elevation illustrating the apparatus of FIGS. 1 and 2 drawn into position in a drain or pipeline as a first stage in repairing a defect in the latter;

FIG. 5 is a view comparable with FIG. 4 but illustrating a subsequent stage in the repair of the drain or pipeline;

FIG. 6 is a view comparable with FIGS. 4 and 5, but showing the drain or pipeline repair completed and the apparatus being withdrawn;

DETAILED DESCRIPTION OF THE ILLUSTRATED EMBODIMENTS

Figure 7:
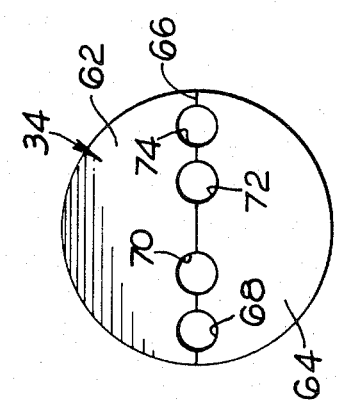
FIG. 7 is an enlarged side elevation illustrating one of the mixing elements present in the apparatus of FIG. 1.

Referring firstly to FIGS. 1 to 3 of the drawings, a preferred embodiment of the drain or pipeline repairing of the invention comprises an ejector body, indicated generally by the reference numeral 20, whose overall configuration is cylindrical or tubular and which is composed of two sections 22, 24 of which one is shown in more detail in FIG. 3. These two sections 22, 24 are substantially identical in form, and are disposed in reversed disposition, end-to-end, relative to one another. They may be, for example, of metal, or a moulded plastics material, preferably the latter so that they may economically be discarded after a small number of uses of the apparatus. The sections 22, 24 are preferably of flexible material to enable them to be used in curved drains or pipelines.

Figure 8:
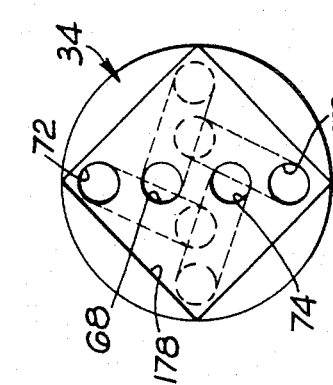
FIG. 8 is a front view, taken from the left hand side considered in relation to FIG. 7, of the mixing element of FIG. 7.
Figure 9:
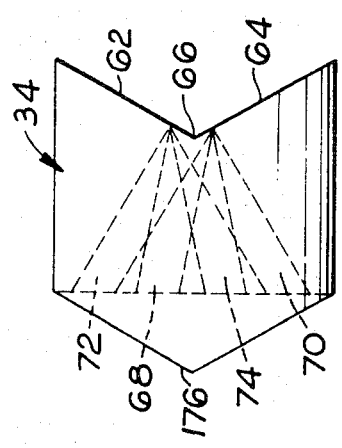
FIG. 9 is a rear view, taken from the right hand side considered in relation to FIG. 7, of the mixing element.

Each of the tubular sections 22, 24 has a relatively wide main bore portion 26 extending from one end thereof and merging into a narrower portion 28 having a threaded portion 30 accommodating a connecting bush 32 whereby the two sections are coupled together. The main bore portion 26 accommodates a succession of mixing elements 34 of which the details are shown in FIGS. 7, 8 and 9 and will be described later.

Adjacent one end, each body section has a circumferential recess 36 accommodating a respective inflatable ring 38 fitted with an inflation valve 40 (in a manner similar to the fitting of a valve into a bicycle tyre inner tube), this valve 40 and the surrounding inflatable ring part being a push sealing fit in a radial opening 42, in the body section, leading to an axial inflation passage 44. Adjacent the inflatable ring 38, disposed in a groove defined between two circumferential ridges 46 is a respective O-ring 48.

At its inner end, the wide main bore portion 26 connects with a plurality of radial passages 50 which communicate with a corresponding array of axial setting-material passages 52 which in turn connect with a multitude of radial outlets 54 which open to the outer curved surface of the body section.

At the trailing end of the body, which is provided by the section 22, an end plate or manifold 56 is bolted thereto and this embodies a coupling for supply ducts, indicated generally by numeral 58, which may be of sectional extensible construction, and which serve to supply the components of a multi component (e.g. two-component) setting composition, for instance an epoxy resin and a hardener, to the main bore portion 26, and to supply compressed air to the inflation passage 44.

As shown in FIGS. 7 to 9, each of the mixing elements 34 disposed in the main bore portion 26 is of circular form in end view, so as to be a snug sliding fit in the bore portion 26, but is shaped at its rear end to provide angled surfaces 62, 64 meeting on a diametrical line 66 along which is a series of holes 68, 70, 72 and 74. At its front end, the element 34 is of complementary angled configuration, as at 176 in FIG. 7, to interfit into the rear end of the next adjacent said mixing element 34, but is formed with a generally square recess 178 into which the holes 68 to 74 open along an imaginary diametrical line which is at right angles to the line 66. It will thus be appreciated that this arrangement provides for there to be a free space (defined by the respective recess 78) between each adjacent pair of the mixing elements 34, and that the holes 68 to 74 are generally in a disposition approximating to a helical configuration, so that liquid material passing through the successive elements 34 from free space to free space will be caused to swirl, and good mixing is achieved in the free spaces.

At the leading end of the body, which is provided by the section 24, a tapered head 76 is bolted thereto, and this is provided with an eye 78 whereby a cable 80 (see FIGS. 4 to 6) may be connected thereto.

FIGS. 4, 5 and 6 illustrate the method of using the apparatus as so far described for the repair of a defect in a drain or pipeline 82, this defect being illustrated as being a collapse of a portion of two adjacent drain or pipeline sections 84 and 86 in register with the usual joint therebetween, to the extent that a large part of the drain or pipeline, as well as the ground thereabove, has been washed away, as indicated at 88, 90.

For effecting the repair, after visual inspection of the drain or pipeline, e.g. by means of closed circuit television or other inspection equipment (not shown), the cable 80 is threaded through the drain or pipeline 82 from an appropriate location such as an inspection chamber (not shown) to one side of the defect 88, 90 and this is connected to the eye 78 of the body 20, the latter being registered with the drain or pipeline at a suitable location (again for instance, an inspection chamber, not shown). Thereupon, the body 20 is drawn along the drain or pipeline 82 to the position illustrated wherein its leading end and its trailing end are to each side of the defect 88, 90, sections of ducting 58 being added as appropriate. Alternatively or supplementarily, the body can be moved along the drain or pipeline by the use of interconnecting rods.

Upon the FIG. 4 position being achieved, the ducting 58 is connected to a compressed air or hydraulic liquid supply to supply air or liquid to the rings 38 to inflate them as shown in FIG. 5 thereby to centre the body 20 and to seal the drain or pipeline 82 at each side of the defect 88, 90. If, as sometimes may be the case, the defect should register with or be disposed closely adjacent to a junction or side connection to the drain or pipeline 82, this junction or side connection will be blocked off using a bag (not shown) which can be inflated from the same compressed air or liquid source.

Sealing of the drain or pipeline 82 having been achieved, the components of a two-component setting composition is rapidly pumped, in accurately metered quantities, and at high pressure, through the ducting, separately to the manifold 56 to enter the main bore portion 26 separately and mix therein as they pass through the mixing elements 34. The components preferably comprise a resinous compound and a hardener respectively, being such that they will set to a relatively coherent mass preferably within two or three minutes and to a hard mass within six to eight minutes depending on ambient temperatures and quantities injected. Accordingly, the pumping-in of the setting composition components is effected rapidly to fill the defect 88, 90, as shown in FIG. 5, and the body 20 is allowed to remain in position just sufficient time for coherence to be achieved. Thereupon, as shown in FIG. 6, the body 20 is drawn back along the drain or pipeline 82 by means of the ducting 58 or by connected cable or rods (not shown) which, of course is dismantled or rewound appropriately. The moving body 20, as it is drawn back, may deposit a thin layer of the setting material on the interior of the non-defective drain or pipeline part, but this need not be a disadvantage. In practice, the inflatable rings 38 can be controlledly deflated or inflated during the moving-back of the body 20 so as to ensure that there is a taper of the setting material surface, merging smoothly with the inner surface of the drain or pipeline 82, and no step or obstruction is created.

Upon withdrawal, the body 20 can be cleared of setting composition components, provided they have not set hard, and may be reused a number of times. The pipelines to the body remain full of the separately delivered resinous compound and hardener and do not require to be cleared between operations, of course.

As will be evident from FIG. 6, the nature of the repair which has been achieved in a full restoration of the missing portion of the drain or pipeline, and simultaneous filling of any adjacent cavity in the adjacent ground, earth or other surrounding environment which, of course, has not been generally possible in non-man entry pipes with prior known drain repair proposals which have been suitable only for relatively small joint leaks and the like. Of course, the method and apparatus as above discussed can, if desired, be used for such repairs if so desired.

Figure 10:
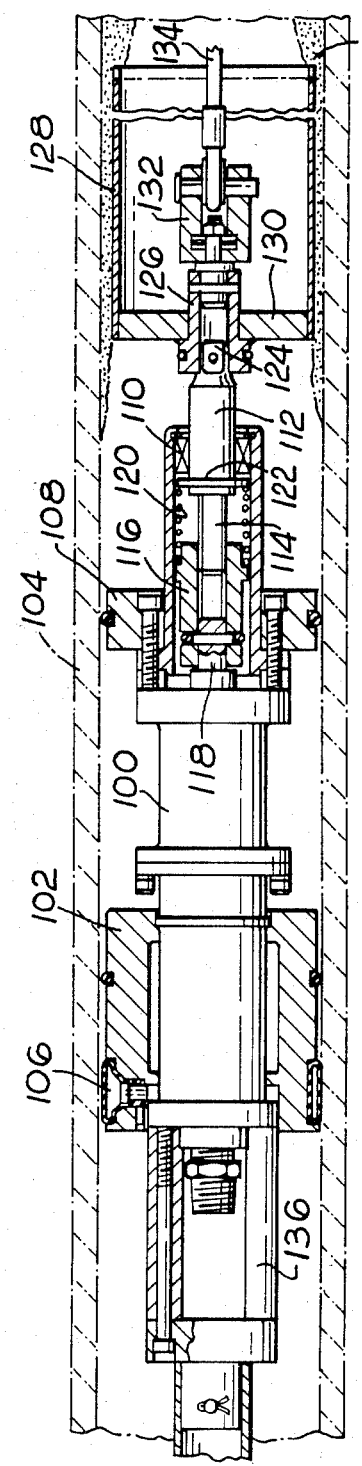
FIG. 10 is a diagrammatic sectional side elevation illustrating a reamer assembly, which may be included in the apparatus of the invention, being drawn through a drain or pipeline after it has been repaired, the scale of this figure being slightly larger than that of FIGS. 4, 5 and 6.

Turning now to FIG. 10 of the drawings, this figure illustrates a practical embodiment of a reamer which may be employed in conjunction with the apparatus above described. This comprises an air motor, indicated generally by the reference numeral 100, located by one end in a tubular adapter 102 whose size is selected according to the size of the drain 104 which is being repaired and which has its own inflatable circumferential ring 106 inflation of which serves to fix the reamer axially within the drain or pipeline 104. The other end of the motor 100 has bolted thereon a steadying and centring disc 108 serving rotatably to support, by a bearing 110, an intermediate stub 112 with a shank 114 thereof slidably, but non-rotatably, engaged into a sleeve 116 secured to shaft 118 of the motor 100. A spring 120 abuts by one end against a shoulder on the sleeve 116 and by the other end against a collar 122 on the stub 112 whereby the latter is yieldingly loaded forwardly in the axial direction away from the motor 100.

Secured onto the front end 124, which is non-round, of the intermediate stub 112 is a boss 126, whereby a cylindrical reaming tool 128, which may be toothed at its front end away from the motor 100, is secured to the stub 112 by way of a rear end disc 130 of the tool 128. In turn a cleat 132 is rotatably fixed axially to the boss 126, within the tool 128, and this enables attachment of a hauling cable 134 to the reamer.

The rear of the reamer may be provided with a rodding connector to facilitate pushing through a drain or pipeline and also withdrawal as may be necessary, in cases where pulling through may be impracticable.

Connected to the rear end of the air motor 100 is a fluid supply duct arranged 136 whereby air or liquid can be supplied (a) to the inflatable ring 106 for arresting the reamer in the drain or pipeline 104 and (b) for driving the motor 100 so as to rotate the tool 128.

This reamer may be used either before use of the apparatus already described, or after the use of such apparatus, or both. As has already been explained, usually an internal inspection will be made of the drain or pipe line 104 to determine what repair(s) may be necessary, for example by use of closed circuit television scanning. If this should reveal the presence of any obstruction, such as debris fallen into and lodged in the drain or pipline, or external matter such as rocks projecting into the opening of the drain or pipeline, or the fact that the shape of the drain or pipeline has been deformed from its intended round cross-section, the reamer will then be drawn through the drain or pipeline, so as to pass and clear the region to be repaired, thereby preparing the drain or pipeline for the repairing operation above described.

After the repairing operation has been effected (as has been shown at 138) the reamer may then be drawn through so as to ensure that the inner cross-section is trued up, and if desired a polishing tool may be employed in the place of the tool 128 for polishing the internal surface of the newly-introduced hardening compound.

The invention is not restricted to the precise details of the foregoing example and variation may be made thereto within the scope of the following claims. Thus, it will readily be understood that the ejector body 20 may be adapted to be pushed through the pipeline instead of being pulled as in the described embodiment. It may be of unitary construction; in the form illustrated, one or more intermediate sections may be incorporated between the body sections 22 and 24 to achieve an overall body length as may be desired or dictated according to the extent of the repair to be effected. The body sections may, if desired, be produced as cheap disposible plastics mouldings which can, if necessary, be discarded after only one or two uses; moreover they may be made of flexible material for use in curved drains or pipelines.

The apparatus can, of course, be used to repair all kinds of defects from very minor cracks or leaks up to major collapses as illustrated. The ejector body and/or the reamer arrangement may, if desired, be adapted to be positioned in and/or processed through the drain or pipeline by means of a tractor which may be driven pneumatically, electrically or in any other suitable way.

I claim:

1. A method of internally repairing a defect in a pipeline having an inside wall which comprises the steps: drawing a tubular ejector body into the pipeline to a position such that its leading and trailing ends are disposed respectively to one side and the other side of the defect for registration with respective relatively intact portions of the pipeline, sealing the leading and trailing ends relative to the respective relatively intact portions of the pipeline by inflating respective sealing rings circumferentially disposed around the body adjacent the ends, separately supplying the components of a setting compound to a mixing means within the ejector body, mixing the components of the setting compound, discharging the mixed setting compound through discharge openings in the ejector body, and displacing the body along the pipeline following coherence of but before complete setting of the compound while deflating the sealing rings for creating a taper on the setting compound.

2. Apparatus for use in internally repairing a defect in a pipeline having an inside wall comprising: an elongated centrally-disposed tubular support having a diameter less than the interior diameter of the pipeline and adapted to be drawn or pushed into a pipeline to such position that the leading and trailing ends of the support are disposed respectively at one side and the other side of the defect, respective inflatable sealing rings circumferentially disposed around the body adjacent the ends, means for expanding the sealing rings into engagement with the inside wall of the pipeline to define a work chamber between the support and the pipeline inside wall, a manifold secured to one end of the support and accommodating supply ducts for the separate supply of the components of a multi-component setting composition charged thereinto, a bore extending axially into the support from the end of the support adjacent to and communicating with the manifold ducts, a plurality of radial passages connects with the bore at the end thereof inboard of the manifold and a corresponding plurality of axial passages connecting with respective radial passages, a plurality of radial outlets connecting with the axial passages and opening to the outer periphery of and along the length of the support between the sealing rings, and a plurality of spaced mixing elements snugly disposed serially within the large diameter bore between the manifold and the plurality or radial passages, each mixing element having angled front and rear surfaces and angularized openings therethrough between the surfaces for the sinusoidal passage and mixing of the components of the setting composition within the support in their seriatim passage from the manifold through the mixing elements to the plurality of passages preliminary to passage through the radial and axial passages and radial outlets and ejection into the work chamber.

3. Apparatus as claimed in claim 2 wherein an eye is provided on the leading end of the support to enable it to be drawn into and out of the pipeline.

4. Apparatus as claimed in claim 2 wherein the leading end of the support is tapered to facilitate its entry into relatively intact pipework after traversing a collapse.

5. Apparatus as claimed in claim 2 further including a reamer assembly for drawing or pushing through the pipeline before or after the repair thereof.

* * * * *